US012719472B2

(12) United States Patent
Wadhwa et al.

(10) Patent No.: US 12,719,472 B2
(45) Date of Patent: Aug. 25, 2026

(54) POWER-ON RESET CIRCUIT

(71) Applicant: NXP B.V., Eindhoven (NL)

(72) Inventors: Sanjay Kumar Wadhwa, Noida (IN); Neha Goel, Noida (IN); Sapna Sharma, Bangalore (IN)

(73) Assignee: NXP B.V., Eindhoven (NL)

( * ) Notice: Subject to any disclaimer, the term of this patent is extended or adjusted under 35 U.S.C. 154(b) by 27 days.

(21) Appl. No.: 18/910,801

(22) Filed: Oct. 9, 2024

(65) Prior Publication Data

US 2025/0202475 A1 Jun. 19, 2025

(30) Foreign Application Priority Data

Dec. 15, 2023 (IN) ............................. 202341085688

(51) Int. Cl.
*H03K 17/22* (2006.01)

(52) U.S. Cl.
CPC .................................. *H03K 17/223* (2013.01)

(58) Field of Classification Search
CPC ........................... H03K 17/223; H03K 17/687
USPC .......................................................... 327/143
See application file for complete search history.

(56) References Cited

U.S. PATENT DOCUMENTS

| | | | | |
|---|---|---|---|---|
| 6,181,173 | B1 | 1/2001 | Homol et al. | |
| 6,288,584 | B1 | 9/2001 | Wu et al. | |
| 6,492,848 | B1 | 12/2002 | Lee | |
| 9,515,637 | B1 | 12/2016 | Schnaitter et al. | |
| 9,654,096 | B1 | 5/2017 | Wadhwa et al. | |
| 2006/0091920 | A1* | 5/2006 | Youssef ............... | H03K 17/223 327/143 |
| 2011/0074470 | A1* | 3/2011 | Sanborn ............... | H03K 17/223 327/143 |
| 2024/0305289 | A1 | 9/2024 | Sharma et al. | |

OTHER PUBLICATIONS

Ay, S. U., "A Nanowatt Cascadable Delay Element for Compact Power-on-Reset (POR) Circuits", 2009 52nd IEEE International Midwest Symposium on Circuits and Systems, pp. 62-65, Aug. 2-5, 2009.

* cited by examiner

*Primary Examiner* — Regis J Betsch
*Assistant Examiner* — Amit R Bhatia

(57) ABSTRACT

A power-on reset (POR) circuit includes a first transistor and a stack of transistors. The first transistor generates an enable voltage based on a first supply voltage. The enable voltage is a reduced version of the first supply voltage and ramps up based on a ramp-up of the first supply voltage. The stack of transistors generates a control voltage. The control voltage is a reduced version of the enable voltage and ramps up based on the ramp-up of the enable voltage. The control voltage delays ramping of the enable voltage such that the enable voltage ramps up to a first threshold voltage associated with the stack of transistors in a first time period. Further, a reset signal generated by the POR circuit is asserted when the enable voltage exceeds the first threshold voltage at the end of the first time period.

21 Claims, 5 Drawing Sheets

POWER-ON RESET CIRCUIT

CROSS-REFERENCE TO RELATED APPLICATIONS

This application claims the priority under 35 U.S.C. § 119 of India application No. 202341085688, filed on 15 Dec. 2023, the contents of which are incorporated by reference herein.

FIELD OF USE

The present disclosure relates generally to electronic circuits, and, more particularly, to a power-on reset circuit.

BACKGROUND

Integrated circuits (ICs) include various functional circuits that are critical for operations thereof. Such functional circuits require a supply voltage to be above a predefined value to ensure accurate execution of operations. A power-on reset (POR) circuit is typically included in the IC to generate a reset signal when the IC is powered ON. The reset signal introduces a delay for reliable initialization of the functional circuits. However, to achieve the desired delay, supplementary components are added to the POR circuit leading to an expansion in the overall size and complexity of the POR circuit. Additionally, the supplementary components consume power thereby reducing compatibility of such POR circuits with low-power ICs.

BRIEF DESCRIPTION OF THE DRAWINGS

The following detailed description of the embodiments of the present disclosure will be better understood when read in conjunction with the appended drawings. The present disclosure is illustrated by way of example, and not limited by the accompanying figures, in which like references indicate similar elements.

DETAILED DESCRIPTION

Figure 1:
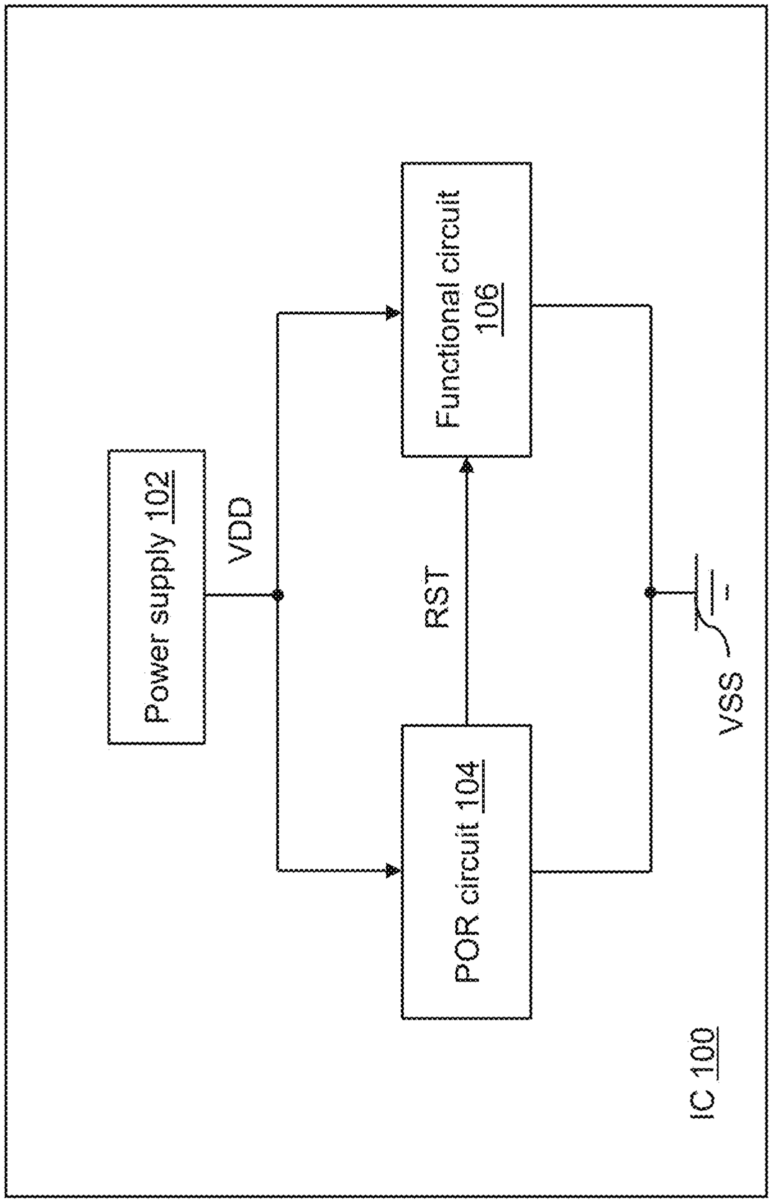
FIG. 1 illustrates a schematic block diagram of a circuit such as an integrated circuit (IC), in accordance with an embodiment of the present disclosure.

The detailed description of the appended drawings is intended as a description of the embodiments of the present disclosure and is not intended to represent the only form in which the present disclosure may be practiced. It is to be understood that the same or equivalent functions may be accomplished by different embodiments that are intended to be encompassed within the spirit and scope of the present disclosure.

Overview:

A power-on reset (POR) circuit generates a reset signal based on the supply of power (e.g., a supply voltage) to an integrated circuit (IC) that includes the POR circuit. During a ramp-up of the supply voltage, the reset signal transitions from a de-asserted state (e.g., a logic low state) to an asserted state (e.g., a logic high state) when the supply voltage exceeds a predetermined threshold. Various components of an integrated circuit (IC) are typically non-operational (e.g., may be in a standby mode) when the reset signal is de-asserted, and may become operational exclusively when the reset signal is asserted. A conventional POR circuit is designed utilizing a combination of various components to enable the generation of the reset signal after a desired time delay. Typically, in a POR circuit, low impedance paths are formed between the supply voltage and a ground terminal during a steady state of the supply voltage. Thus, the POR circuit consumes a steady-state current when the supply voltage is at the steady state, leading to increased static power consumption. POR circuits that are designed to reduce the static power consumption, are unable to provide a desired trip level accuracy in generating the reset signal when the supply voltage exceeds the predetermined threshold during the ramp-up of the supply voltage. Additionally, the reset signal may be asserted due to a leakage current in the POR circuit, thereby generating a false assertion of the reset signal.

Various embodiments of the present disclosure disclose an IC that includes a power supply, a POR circuit, and a functional circuit. The POR circuit may generate a reset signal when a first supply voltage is above a predefined value to ensure an accurate execution of associated operations of the functional circuit. Such a predefined value of the first supply voltage is referred to as a trip value. The POR circuit may include a first transistor, a stack of transistors, and a logic circuit. The first transistor generates an enable voltage based on the first supply voltage such that the enable voltage ramps up based on a ramp-up of the first supply voltage. The stack of transistors generates a control voltage and a trigger voltage based on the enable voltage and the first supply voltage. Further, the logic circuit may generate the reset signal based on the enable voltage and the trigger voltage.

When the enable voltage is lower than a first threshold voltage associated with the stack of transistors, the control voltage ramps based on ramping of the enable voltage, and the trigger voltage remains above a second supply voltage. Based on the ramping of the control voltage, the enable voltage ramps up to the first threshold voltage in a first time period. At the end of the first time period, the trigger voltage falls to the second supply voltage thereby asserting the reset signal. Thus, during the ramp-up of the first supply voltage, the reset signal is de-asserted when the first supply voltage is less than the trip value. A ramping rate of the enable voltage is controlled by the control voltage such that the enable voltage exceeds the first threshold voltage at the end of the first time period when the first supply voltage exceeds the trip value, and the reset signal transitions from the de-asserted state to the asserted state. When the enable voltage exceeds the first threshold voltage, the control voltage is pulled to the second supply voltage (e.g., a ground voltage) by the stack of transistors. Additionally, during a steady state of the first supply voltage, the enable voltage equals the first supply voltage, and the trigger voltage and the control voltage equals the second supply voltage.

The POR circuit of the present disclosure utilizes a lower number of delay elements to generate the reset signal with the desired time delay (e.g., the first time period) as compared to conventional POR circuits. Further, the POR circuit may achieve identical trip level accuracy over a wide range of ramp-up rates of the first supply voltage and a wide temperature range while occupying a smaller footprint compared to the conventional POR circuits. During the steady state of the first supply voltage, the control voltage and the trigger voltage are at the second supply voltage, and the enable voltage is equal to the first supply voltage. In other words, low impedance paths between a power supply and a second first supply voltage terminal (e.g., a ground terminal) are prevented during the steady state in the POR circuit of the present disclosure. Thus, the consumption of non-zero steady-state currents by the POR circuit is prevented. Consequently, the power consumption of the IC of the present disclosure is significantly reduced as compared to the power consumed by conventional POR circuits. Therefore, the POR circuit of the present disclosure offers higher efficiency and is more compact than conventional POR circuits. As the reset signal is asserted based on the enable voltage and the trigger voltage, an effect of leakage current from the logic circuit is minimal on the assertion of the reset signal. Therefore, the POR circuit of the present disclosure is significantly robust across process, voltage, and temperature (PVT) variations and different supply ramp-up rates.

FIG. 1 illustrates a schematic block diagram of a circuit 100 such as an integrated circuit (IC) 100 in accordance with an embodiment of the present disclosure. The IC 100 may include a power supply 102, a power-on reset (POR) circuit 104, and a functional circuit 106. The IC 100 may be implemented in power regulators, digital signal processing systems, a system on a chip (SoC), a communication system, or the like. Although FIG. 1 illustrates that the power supply 102, the POR circuit 104, and the functional circuit 106 are implemented on the IC 100, the scope of the present disclosure is not limited to it. In various other embodiments, some circuits may be external to the IC 100. For example, in some embodiments, the power supply 102 may be external to the IC 100.

The power supply 102 may be configured to generate a first supply voltage VDD. In an example, the first supply voltage VDD equals 2.4 volts (V). However, the first supply voltage VDD may have other values in various other embodiments.

The POR circuit 104 may be configured to ensure reliable initialization of the functional circuit 106 such that the functional circuit 106 may operate in a known and stable state. The POR circuit 104 may be coupled to the power supply 102 and a second supply voltage terminal. In an embodiment, the second supply voltage terminal may be a ground terminal. The POR circuit 104 may be configured to receive the first supply voltage VDD from the power supply 102 and generate a reset signal RST when the first supply voltage VDD is above a predefined value. The first supply voltage VDD is selected to be above the predefined value to ensure that the functional circuit 106 may receive the first supply voltage VDD at a desired level. The predefined value of the first supply voltage VDD may be referred to as a trip value in the ongoing description. In an embodiment, during a ramp-up of the first supply voltage VDD, the reset signal RST is de-asserted (e.g., the reset signal RST is at a logic low state) when the first supply voltage VDD is less than the trip value. When the first supply voltage VDD exceeds the trip value, the reset signal RST transitions from the de-asserted state to an asserted state (e.g., a logic high state). Further, the reset signal RST remains asserted for the remaining duration of the ramp-up and during a steady state of the first supply voltage VDD (e.g., when the first supply voltage VDD is constant). The trip value may remain significantly stable across different ramp-up rates of the first supply voltage VDD. The POR circuit 104 may utilize a lower number of delay elements to generate the reset signal RST with a desired time delay, thereby occupying a smaller footprint compared to a conventional POR circuit. For example, the POR circuit 104 may occupy a 40% smaller footprint compared to the conventional POR circuit.

An implementation of the POR circuit 104 may not be limited to any specific complementary metal oxide semiconductor (CMOS) technology and may be used in any standard CMOS technology. Examples of the standard CMOS technology may include 40 nanometers (nm) CMOS, 22 nm CMOS, 14 nm CMOS, 7 nm CMOS, or the like. In an exemplary embodiment, the POR circuit 104 may be compatible with a wide range of ramp-up rates (e.g., 100 microseconds (μs)-100 milliseconds (ms)). Additionally, the POR circuit 104 may be capable of detecting the trip value (e.g., 0.85V) of the first supply voltage VDD over the wide range of the ramp-up rates with high accuracy (e.g., 5 sigma). Further, the POR circuit 104 may only occupy an area of 0.008 square millimeters (mm2). Additionally, all the voltages and signals of the POR circuit 104 are equal to the first supply voltage VDD or a second supply voltage VSS, during the steady state of the first supply voltage VDD. As a result, the consumption of non-zero steady-state (e.g., quiescent) currents by the POR circuit 104 is prevented. The POR circuit 104 is explained in detail in conjunction with FIGS. 2 and 3.

The functional circuit 106 may be coupled to the power supply 102, the POR circuit 104, and the second supply voltage terminal. The functional circuit 106 may include suitable circuitry that may be configured to perform one or more operations. For example, the functional circuit 106 may be configured to receive the first supply voltage VDD and the reset signal RST from the power supply 102 and the POR circuit 104, respectively. Based on the asserted state of the reset signal RST, the functional circuit 106 may be further configured to execute one or more operations associated therewith. Further, based on the de-asserted state of the reset signal RST, the functional circuit 106 may be non-operational (e.g., may be in a standby mode). Thus, the reset signal RST ensures that the functional circuit 106 is operational when the first supply voltage VDD is within a desired range (e.g., above the trip value).

In an embodiment, the functional circuit 106 is an exemplary functional circuit that may utilize the reset signal RST to execute an operation of the functional circuit 106. However, the scope of the present disclosure is however not limited to it. In various other embodiments, the reset signal RST may be utilized by various other functional circuits of the IC 100, without deviating from the scope of the present disclosure. Examples of the functional circuit 106 may include, analog circuits, application-specific integrated circuits (ASICs), a digital circuit, a memory circuit, a sensor, an input/output circuit, a processor circuit, a communications circuit, or any combination thereof.

The scope of the present disclosure is not limited to the second supply voltage terminal being a low supply voltage terminal. In other embodiments, the second supply voltage VSS of the second supply voltage terminal may correspond to a non-zero value (e.g., −1V, 1V, or the like).

Figure 2:
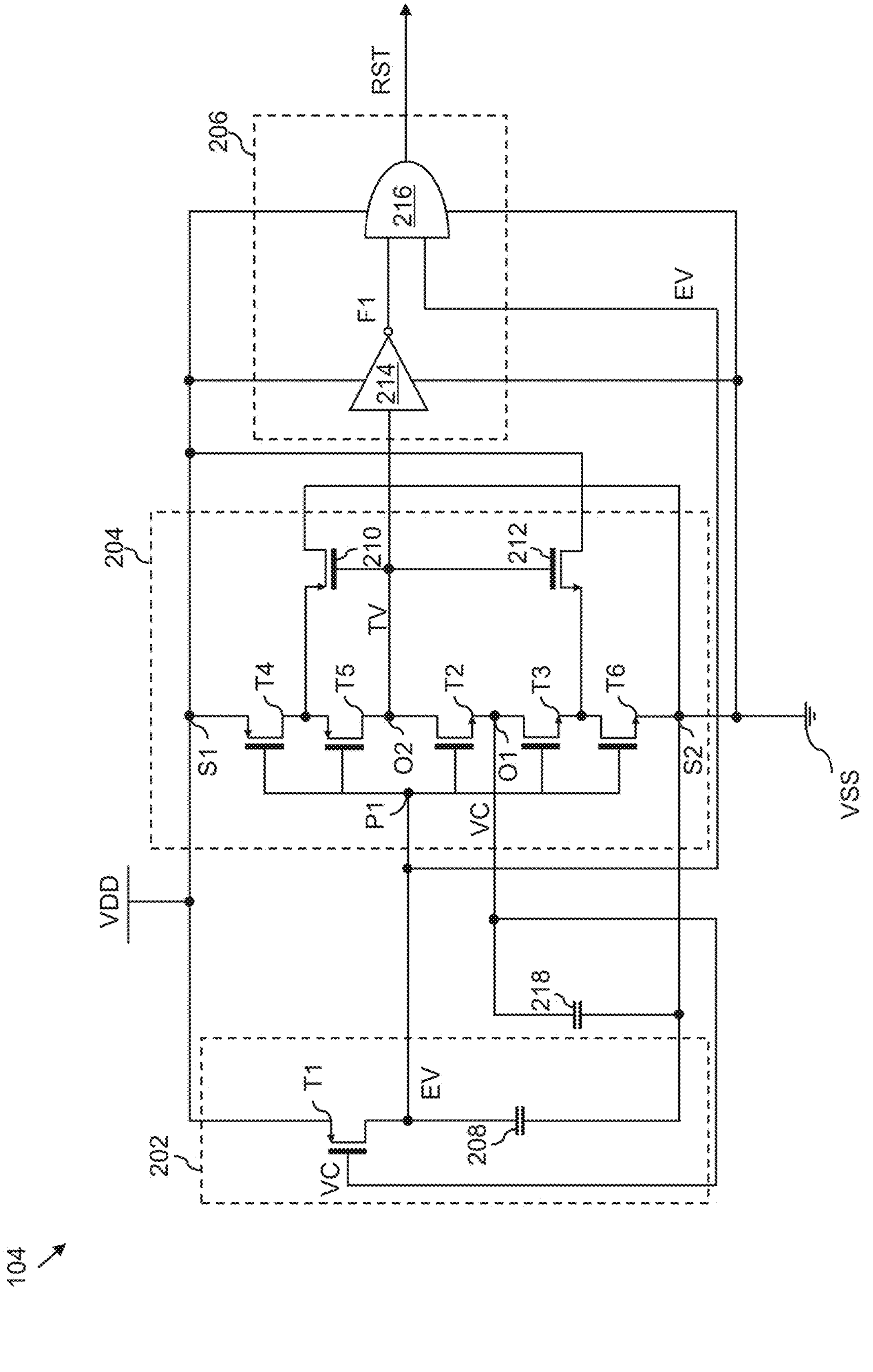
FIG. 2 illustrates a schematic circuit diagram of a power-on reset (POR) circuit of the IC of FIG. 1, in accordance with an embodiment of the present disclosure.

FIG. 2 illustrates a schematic circuit diagram of the POR circuit 104 in accordance with an embodiment of the present disclosure. The POR circuit 104 may include a delay circuit 202, a hysteresis circuit 204, and a logic circuit 206.

Delay Circuit 202:

The delay circuit 202 may be coupled to a first supply voltage terminal and the second supply voltage terminal. The delay circuit 202 may be configured to receive the first supply voltage VDD. The delay circuit 202 may be further configured to generate an enable voltage EV such that the enable voltage EV ramps up based on the ramp-up of the first supply voltage VDD. The delay circuit 202 may include a first transistor T1 and a first capacitor 208.

The first transistor T1 may be coupled to the first supply voltage terminal (e.g., power supply 102). Examples of the first transistor T1 may include a bipolar junction transistor (BJT), a field-effect transistor (FET), an insulated gate bipolar transistor (IGBT), or the like. In an embodiment, the first transistor T1 corresponds to a p-channel metal-oxide-semiconductor (PMOS) transistor. The first transistor T1 may include first and second current terminals and a control terminal. In the present disclosure, first and second current terminals of a transistor correspond to source and drain terminals of the transistor, respectively, and a control terminal corresponds to a gate terminal of the transistor.

The first current terminal of the first transistor T1 may be coupled to the first supply voltage terminal. The first current terminal of the first transistor T1 may be configured to receive the first supply voltage VDD from the first supply voltage terminal. The second current terminal of the first transistor T1 may be configured to generate the enable voltage EV when the first supply voltage VDD crosses a threshold voltage of the first transistor T1. Further, the control terminal of the first transistor T1 may be configured to receive a control voltage VC.

The first capacitor 208 may be coupled between the second current terminal of the first transistor T1 and the second supply voltage terminal. The first capacitor 208 may charge based on a voltage difference between the enable voltage EV at the second current terminal of the first transistor T1 and the second supply voltage VSS at the second supply voltage terminal. Based on the charging of the first capacitor 208, a ramping rate of the enable voltage EV up to a first threshold voltage associated with the hysteresis circuit 204 is regulated. In other words, a capacitance associated with the first capacitor 208 may control the ramping rate of the enable voltage EV up to the first threshold voltage. For example, a capacitor with 10 picofarads (pF) may be utilized in place of a capacitor with 5 pF to further delay the ramping rate of the enable voltage EV up to the first threshold voltage when the first supply voltage VDD ramps up at a fast rate (e.g., less than 10 μs). The first threshold voltage of the hysteresis circuit 204 may be a voltage level at which an output of the hysteresis circuit 204 falls below the second supply voltage VSS.

The enable voltage EV ramps up based on the ramp-up of the first supply voltage VDD. The enable voltage EV is generated based on the first supply voltage VDD and is lower than the first supply voltage VDD until the first supply voltage VDD ramps up and reaches the steady state and the first capacitor 208 is charged. In an embodiment, the enable voltage EV is equal to a difference between the first supply voltage VDD and the threshold voltage (hereinafter referred to as a “second threshold voltage”) of the first transistor T1, until the first supply voltage VDD ramps up and reaches the steady state and the first capacitor 208 is charged. When the control voltage VC increases, a rate of increase of a voltage difference (e.g., a gate to source voltage) between (i) the first supply voltage VDD at the first current terminal of the first transistor T1 and (ii) the control voltage VC at the control terminal of the first transistor T1, is reduced. For example, initially, the rate of increase of the voltage difference between the first supply voltage VDD and the control voltage VC is at a first rate. Further, when the control voltage VC increases, the rate of increase of the voltage difference between the first supply voltage VDD and the control voltage VC is at a second rate such that the first rate is greater than the second rate.

An attribute may be associated with the first transistor T1 such that the attribute may vary based on the voltage difference between the first supply voltage VDD at the first current terminal of the first transistor T1 and the control voltage VC at the control terminal of the first transistor T1. Additionally, a rate of change of an attribute associated with the first transistor T1 may alter based on the change in the rate of increase of the voltage difference between the first supply voltage VDD and the control voltage VC. Examples of the attribute of the first transistor T1 is one of a group consisting of resistance, impedance, admittance, and reactance. Based on the rate of change of an attribute the ramping rate associated with the enable voltage EV may be delayed. For example, the enable voltage EV may ramp up to the first threshold voltage in a first time period. Further, the first time period may be equal to the time required by the first supply voltage VDD to exceed the trip value. In an embodiment, the rate of change of the attribute refers to a rate of fall of an ON resistance (e.g., a channel resistance) associated with the first transistor T1.

Hysteresis Circuit 204:

The hysteresis circuit 204 may be coupled to the first supply voltage terminal, the delay circuit 202, and the second supply voltage terminal. The hysteresis circuit 204 may include a stack of transistors T2-T6, a first feedback transistor 210, and a second feedback transistor 212.

The stack of transistors T2-T6 may include a first supply node S1, a second supply node S2, an input node P1, a first output node O1, and a second output node O2. The first supply node S1 may be coupled to the first supply voltage terminal. Further, the first supply node S1 may be configured to receive the first supply voltage VDD. The second supply node S2 may be coupled to the second supply voltage terminal. Further, the second supply node S2 may be configured to receive the second supply voltage VSS.

The input node P1 may be coupled to the delay circuit 202 (e.g., the input node P1 may be coupled to the second current terminal of the first transistor T1). Further, the input node P1 may be configured to receive the enable voltage EV. The first output node O1 may be coupled to the delay circuit 202. Further, the first output node O1 may be configured to generate the control voltage VC. The second output node O2 may be configured to generate a trigger voltage TV such that the trigger voltage TV may follow the first supply voltage VDD when the enable voltage EV is less than the first threshold voltage.

The stack of transistors T2-T6 may be configured to pull down the control voltage VC to the second supply voltage VSS when the enable voltage EV equals the first threshold voltage associated with the stack of transistors T2-T6 (e.g., the first threshold voltage associated with the hysteresis circuit 204).

The stack of transistors T2-T6 may further include a stack of first conductivity type transistors and a stack of second conductivity type transistors. In an embodiment, the stack of first conductivity type transistors may correspond to a stack of n-channel metal oxide semiconductor (NMOS) transistors, and a stack of second conductivity type transistors may correspond to a stack of PMOS transistors. Further, the stack of first conductivity type transistors and the stack of second conductivity type transistors may be connected together at an output node. The output node may correspond to the second output node O2 of the stack of transistors such that the trigger voltage TV may be generated at the first output node.

The stack of first conductivity type transistors may include a second transistor T2 and a third transistor T3. The stack of second conductivity type transistors may include a fourth transistor T4 and a fifth transistor T5. Additionally, the stack of first conductivity type transistors may include a sixth transistor T6. Each of the second transistor T2, the third transistor T3, and the sixth transistor T6 may include a first current terminal, a control terminal, and a second current terminal.

The control terminal of the second transistor T2 may be coupled to the second current terminal of the first transistor T1. The control terminal of the second transistor T2 may be configured to receive the enable voltage EV. The first current terminal of the second transistor T2 may be coupled to the control terminal of the first transistor T1. Further, the first current terminal of the second transistor T2 may be configured to generate the control voltage VC when the enable voltage EV (e.g., a voltage difference between the enable voltage EV at the control terminal of the second transistor T2 and the control voltage VC at the first current terminal of the second transistor T2) crosses a third threshold voltage (e.g., 0.7V) of the second transistor T2. Additionally, the control voltage VC may be generated based on a parasitic capacitance between the second current terminal of the first transistor T1 and the first current terminal of the second transistor T2 (e.g., a parasitic capacitance between the control terminal and the first current terminal of the second transistor T2). In an embodiment, the parasitic capacitance may arise due to a physical overlap between a gate electrode and a source region of the second transistor T2. When the enable voltage EV is applied to the control terminal of the second transistor T2, electric fields may extend into the source region, thereby generating the control voltage VC.

The control terminal of the third transistor T3 may be coupled to the second current terminal of the first transistor T1. Further, the control terminal of the third transistor T3 may be configured to receive the enable voltage EV. The second current terminal of the third transistor T3 may be coupled to the first current terminal of the second transistor T2.

The fourth transistor T4 and the fifth transistor T5 may include a first current terminal, a control terminal, and a second current terminal.

The first current terminal of the fourth transistor T4 may be coupled to the first supply voltage terminal. Further, the first current terminal of the fourth transistor T4 may be configured to receive the first supply voltage VDD. The control terminal of the fourth transistor T4 may be coupled to the second current terminal of the first transistor T1 and configured to receive the enable voltage EV. The first current terminal of the fifth transistor T5 may be coupled to the second current terminal of the fourth transistor T4. The control terminal of the fifth transistor T5 may be coupled to the second current terminal of the first transistor T1 and configured to receive the enable voltage EV. The second current terminal of the fifth transistor T5 may be coupled to the second current terminal of the second transistor T2. Further, the second current terminal of the fifth transistor T5 may be configured to generate the trigger voltage TV when the enable voltage EV is less than the first threshold voltage. In an embodiment, the second current terminal of the fourth transistor T4 may be configured to generate a first intermediate voltage (not shown), such that the first intermediate voltage equals the first supply voltage VDD.

The control voltage VC may ramp-up as the enable voltage EV ramps up (as negligible current may flow from the first terminal of the second transistor T2 towards the second current terminal of the third transistor T3). Further, based on the control voltage VC, the rate of increase of the voltage difference (e.g., the gate to source voltage) between the first supply voltage VDD at the first current terminal of the first transistor T1 and the control voltage VC at the control terminal of the first transistor T1 is reduced (e.g., reduces from the first rate to the second rate). Thus, the rate of change of the attribute associated with the first transistor T1 is reduced. In an embodiment, coupling between the control terminals of the second transistor T2, the third transistor T3, the fourth transistor T4, the fifth transistor T5, and the sixth transistor T6 that receive the enable voltage EV, corresponds to the input node P1 of the stack of transistors T2-T6. The first current terminal of the fourth transistor T4 corresponds to the first supply node S1 of the stack of transistors T2-T6. Further, the first current terminal of the second transistor T2 corresponds to the first output node O1 of the stack of transistors T2-T6 such that the control terminal and the second current terminal of the first transistor T1 are coupled across the first output node O1 and the input node P1 of the stack of transistors T2-T6, respectively. Further, the coupling between the second current terminals of the second transistor and the fifth transistor corresponds to the second output node O2 of the stack of transistors T2-T6.

The control terminal of the sixth transistor T6 may be coupled to the second current terminal of the first transistor T1. Further, the control terminal of the sixth transistor T6 may be configured to receive the enable voltage EV. The second current terminal of the sixth transistor T6 may be coupled to the first current terminal of the third transistor T3. Additionally, the second current terminal of the sixth transistor T6 may be configured to receive a voltage (e.g., a second intermediate voltage (not shown)) from the second feedback transistor 212. Further, the first current terminal of the sixth transistor T6 may be coupled to the second supply voltage terminal. The first current terminal of the sixth transistor T6 may be configured to receive the second supply voltage VSS (e.g., the ground voltage).

The first feedback transistor 210 and the second feedback transistor 212 may include a first current terminal, a control terminal, and a second current terminal.

The control terminal of the first feedback transistor 210 may be coupled to the second current terminals of the fifth transistor T5 and the second transistor T2. The control terminal of the first feedback transistor 210 may be configured to receive the trigger voltage TV. The first current terminal of the first feedback transistor 210 may be coupled to the second current terminal of the fourth transistor T4. The first current terminal of the first feedback transistor 210 may be configured to receive the first intermediate voltage. Further, the second current terminal of the first feedback transistor 210 may be coupled to the second supply voltage terminal. The second current terminal of the first feedback transistor 210 may be configured to receive the second supply voltage VSS (e.g., the ground voltage).

The first feedback transistor 210 may be configured to remain in an OFF state (e.g., non-conducting state) when the enable voltage EV is less than the first threshold voltage. Additionally, the first feedback transistor 210 may be configured to turn ON (e.g., remain in a conducting state) when the enable voltage EV exceeds the first threshold voltage. The first feedback transistor 210 may be further configured to drive the first intermediate voltage at the first current terminal of the fifth transistor T5 to the second supply voltage VSS. In an embodiment, the second current terminal of the first feedback transistor 210 may be coupled to the first current terminal of the sixth transistor T6. The coupling between the second current terminal of the first feedback transistor 210 and the first current terminal of the sixth transistor T6 corresponds to the second supply node S2 of the stack of transistors T2-T6.

The control terminal of the second feedback transistor 212 may be coupled to the second current terminals of the fifth transistor T5 and the second transistor T2. The second current terminal of the second feedback transistor 212 may be coupled to the first supply voltage terminal. The second current terminal of the second feedback transistor 212 may be configured to receive the first supply voltage VDD. The first current terminal of the second feedback transistor 212 may be coupled to the first current terminal of the third transistor T3. Further, the first current terminal of the second feedback transistor 212 may be configured to generate the second intermediate voltage (not shown), such that the second intermediate voltage is equal to the first supply voltage VDD.

The second feedback transistor 212 may be configured to remain in an ON state (e.g., a conducting state) when the enable voltage EV is less than the first threshold voltage. The second feedback transistor 212 may be further configured to drive the voltage at the second current terminal of the sixth transistor T6 to the first supply voltage VDD. Additionally, the second feedback transistor 212 may be configured to remain in an OFF state (e.g., a non-conducting state) when the enable voltage EV exceeds the first threshold voltage.

The POR circuit 104 may further include a second capacitor 218. The second capacitor 218 may be coupled between the first current terminal of the second transistor T2 and the second supply voltage terminal.

The second capacitor 218 may charge based on a voltage difference between the control voltage VC at the first current terminal of the second transistor T2 and the second supply voltage VSS at the second supply voltage terminal. In an embodiment, when the first supply voltage VDD ramps up at a fast rate (e.g., less than 10 μs), the second capacitor 218 may further charge at a rate such that the control voltage VC is initially maintained close to the second supply voltage VSS. Based on the charging of the second capacitor 218, a ramp-up of the control voltage VC may be regulated. For example, a capacitor with 10 picofarads (pF) may be utilized in place of a capacitor with 5 pF to delay the ramping rate of the control voltage VC when the first supply voltage VDD ramps up at a faster rate. Further, when the enable voltage EV exceeds the first threshold voltage, the third transistor T3 and the sixth transistor T6 may turn ON such that the control voltage VC is pulled down to the second supply voltage VSS. Further, the trigger voltage TV may fall to the second supply voltage VSS. Based on the trigger voltage TV and the enable voltage EV, the reset signal RST may be asserted. In an embodiment, the first supply voltage VDD crosses the trip value at a time instance when the control voltage VC is pulled down to the second supply voltage VSS such that the reset signal RST is asserted. Further, the attribute of the first transistor T1 is reduced (e.g., the ON resistance of the first transistor T1 is reduced) such that the ramping rate of the enable voltage EV is accelerated. For example, initially, the ramping rate of the enable voltage EV is at a third rate. Further, when the attribute of the first transistor T1 is reduced, the ramping rate of the enable voltage EV is accelerated to a fourth rate such that the fourth rate is greater than the third rate.

Although it is mentioned that the time instance of the first supply voltage VDD crossing the trip value is the same as a time instance when the control voltage VC is pulled down to the second supply voltage VSS, in various other embodiments, the time instance of the first supply voltage VDD crossing the trip value and the time instance when the control voltage VC is pulled down to the second supply voltage VSS may be different.

Logic Circuit 206:

The logic circuit 206 may be coupled between the first supply voltage terminal and the second supply voltage terminal. The logic circuit 206 may be configured to receive the first supply voltage VDD and the second supply voltage VSS. Further, the logic circuit 206 may be coupled to the delay circuit 202 and the hysteresis circuit 204. The logic circuit 206 may be configured to receive the trigger voltage TV and the enable voltage EV. The logic circuit 206 may be further configured to generate the reset signal RST based on the trigger voltage TV and the enable voltage EV such that the reset signal RST is asserted when the enable voltage EV is above the second supply voltage VSS and the trigger voltage TV falls to the second supply voltage VSS.

The logic circuit 206 may include a first logic gate 214 and a second logic gate 216. The first logic gate 214 may be coupled between the first supply voltage terminal and the second supply voltage terminal. The first logic gate 214 may be further coupled to the second output node O2 of the hysteresis circuit 204 (e.g., between the second current terminal of the fifth transistor T5 and the second current terminal of the second transistor T2). The first logic gate 214 may be configured to receive the trigger voltage TV. The first logic gate 214 may be further configured to generate a first output voltage F1 such that the first output voltage F1 equals one of the first supply voltage VDD and the second supply voltage VSS. In an embodiment, the first logic gate 214 is an inverter such that the first output voltage F1 is an inverted version of the trigger voltage TV. For example, the first output voltage F1 equals the first supply voltage VDD voltage when the trigger voltage TV falls to the second supply voltage VSS. Alternatively, the first output voltage F1 falls to the second supply voltage VSS when the trigger voltage TV is above the second supply voltage VSS.

The second logic gate 216 may be coupled between the first supply voltage terminal and the second supply voltage terminal. The second logic gate 216 may be further coupled to the first logic gate 214 and the second current terminal of the first transistor T1. The first logic gate 214 may be configured to receive the first output voltage F1 from the first logic gate 214, and the enable voltage EV from the first transistor T1. The second logic gate 216 may be further configured to generate the reset signal RST. In an embodiment, the second logic gate 216 is an AND gate such that the reset signal RST is a logical AND of the enable voltage EV and the first output voltage F1. For example, the reset signal RST is asserted when the first output voltage F1 equals the first supply voltage VDD and the enable voltage EV is above the second supply voltage VSS.

In Operation:

Initially, during the ramp-up of the first supply voltage VDD (e.g., when the first supply voltage VDD ramps up from 0V), the first transistor T1 is turned OFF and the enable voltage EV and the control voltage VC are at 0V. Further, the fourth transistor T4 may turn ON as the first supply voltage VDD ramps up such that a voltage difference (e.g., the gate to source voltage) between the first supply voltage VDD at the first current terminal of the fourth transistor T4 and the enable voltage EV at the control terminal of the fourth transistor T4, is less than a fourth threshold voltage (e.g., −0.2V) of the fourth transistor T4. Additionally, the fifth transistor T5 may turn ON such that the trigger voltage TV equals the first supply voltage VDD. The first feedback transistor 210 may be turned OFF as a voltage at the first current terminal of the first feedback transistor 210 equals a voltage (e.g., the first supply voltage VDD) at the control terminal of the first feedback transistor 210. Further, the second feedback transistor 212 is turned ON as a voltage at the second current terminal of the second feedback transistor 212 equals a voltage (e.g., the first supply voltage VDD) at the control terminal of the second feedback transistor 212. The second feedback transistor 212 may be configured to generate the second intermediate voltage that equals the first supply voltage VDD such that the second current terminal of the sixth transistor T6 may receive the first supply voltage VDD.

The first output voltage F1 may fall to the second supply voltage VSS as the trigger voltage TV is above the second supply voltage VSS (e.g., 0V). In an exemplary scenario, during the ramp-up of the first supply voltage VDD, the first output voltage F1 equals the first supply voltage VDD based on a leakage current from the first logic gate 214. The second logic gate 216 may only assert the reset signal RST when the first output voltage F1 equals the first supply voltage VDD and the enable voltage EV is above the second supply voltage VSS. In other words, the second logic gate 216 may prevent an unintended assertion of the reset signal RST.

The first transistor T1 may generate the enable voltage EV when the first supply voltage VDD may further ramp-up and cross the second threshold voltage. The first capacitor 208 may charge based on the voltage difference between the enable voltage EV and the second supply voltage VSS. Based on the enable voltage EV crossing the third threshold voltage of the second transistor T2 and the parasitic capacitance between the control terminal and the first current terminal of the second transistor T2, the control voltage VC may be generated. The control voltage VC may ramp-up as the enable voltage EV ramps up. Further, based on the control voltage VC, the rate of increase of the voltage difference (e.g., the gate to source voltage) between the first supply voltage VDD at the first current terminal of the first transistor T1 and the control voltage VC at the control terminal of the first transistor T1, is reduced. Thus, the rate of fall of the ON resistance associated with the first transistor T1 (e.g., the rate at which the ON resistance of the first transistor T1 falls) alters.

As the enable voltage EV ramps up and crosses the first threshold voltage, the second transistor T2, the third transistor T3, and the sixth transistor T6 may turn ON such that the control voltage VC is pulled down to the second supply voltage VSS and the trigger voltage TV falls to the second supply voltage VSS (e.g., the trigger voltage TV falls to the ground voltage). The first feedback transistor 210 may be turned ON as the voltage at the control terminal of the first feedback transistor 210 is equal to the second supply voltage VSS (e.g., the ground voltage). The first feedback transistor 210 may drive the voltage at the first current terminal of the fifth transistor T5 to the second supply voltage VSS.

The first logic gate 214 may generate the first output voltage F1 such that the first output voltage F1 equals the first supply voltage VDD based on the trigger voltage TV falling to the second supply voltage VSS. Further, the second logic gate 216 may receive the first output voltage F1 from the first logic gate 214, and the enable voltage EV from the first transistor T1. The second logic gate 216 may assert the reset signal RST as the first output voltage F1 equals the first supply voltage VDD and the enable voltage EV is above the second supply voltage VSS.

The scope of the present disclosure is not limited to the delay circuit 202, the hysteresis circuit 204, and the logic circuit 206 being implemented in the above-described manner. In various other embodiments, different or additional components may be utilized for implementing the delay circuit 202, the hysteresis circuit 204, and the logic circuit 206, without deviating from the scope of the present disclosure.

Figure 3:
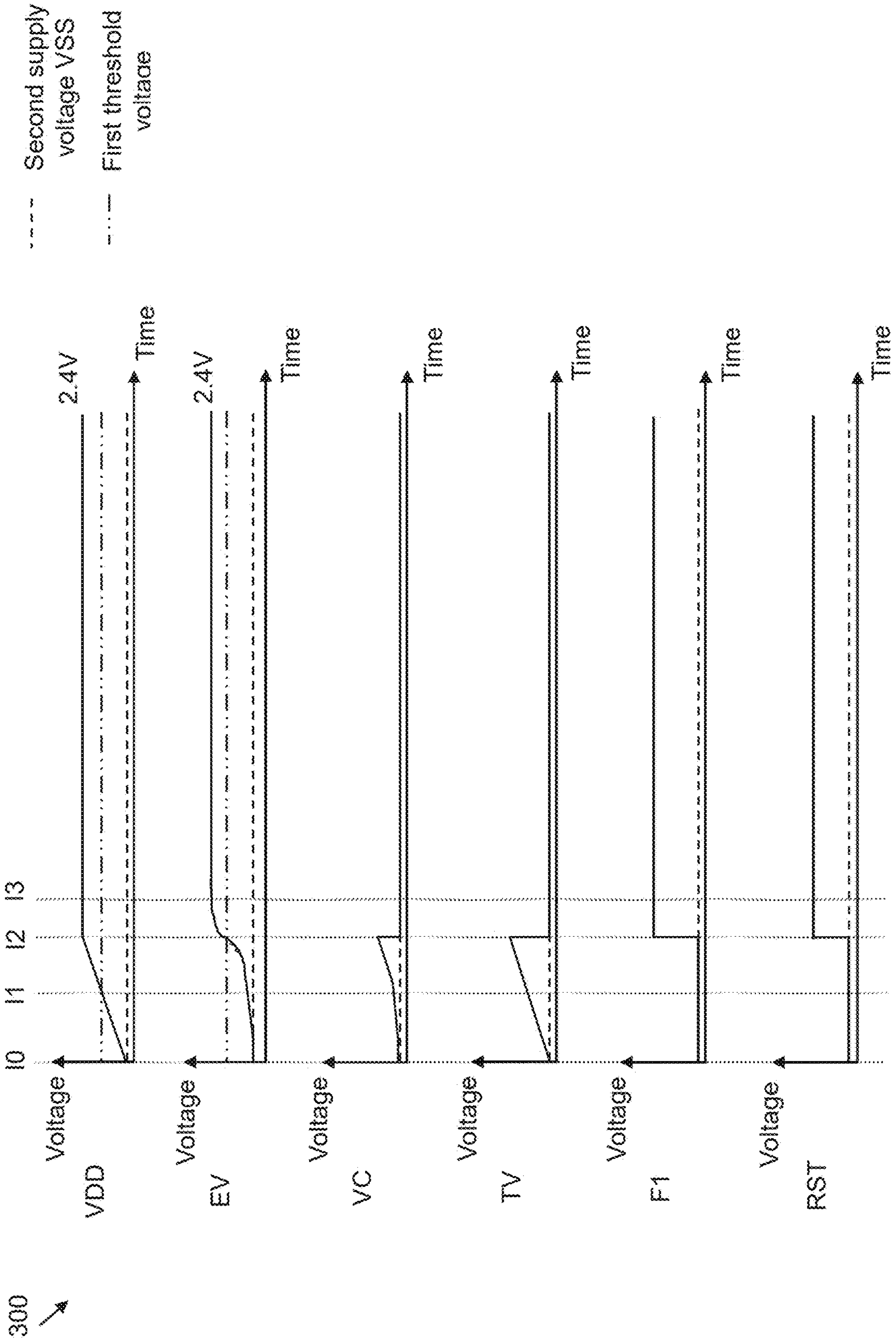
FIG. 3 represents a timing diagram that illustrates an operation of the POR circuit of the IC of FIG. 1 with a first ramp rate of a first supply voltage, in accordance with an embodiment of the present disclosure.

FIG. 3 represents a timing diagram 300 that illustrates the operation of the POR circuit 104 with a first ramp rate of the first supply voltage VDD, in accordance with an embodiment of the present disclosure.

The timing diagram 300 illustrates the first supply voltage VDD ramping at the first ramp rate (e.g., when the first supply voltage VDD ramp-ups from 0V to 2.4V in 1 ms).

At time instance I0, the IC 100 is powered up. The first transistor T1 is turned OFF and the enable voltage EV and the control voltage VC are at 0V. Further, the fourth transistor T4 and the fifth transistor T5 may be turned OFF.

During a time period I0-I1, the first supply voltage VDD may ramp-up. The first transistor T1 may generate the enable voltage EV when the first supply voltage VDD may ramp-up and cross the second threshold voltage. As the enable voltage EV follows the first supply voltage VDD and is a reduced version of the first supply voltage VDD, the enable voltage EV ramps up during the time period I0-I1. Further, the enable voltage EV remains less than the first supply voltage VDD. Based on the enable voltage EV crossing the third threshold voltage of the second transistor T2 and the parasitic capacitance between the control terminal and the first current terminal of the second transistor T2, the control voltage VC may be generated. The control voltage VC follows the enable voltage EV and is a reduced version of the enable voltage EV. The control voltage VC ramps up during the time period I0-I1 and is less than the enable voltage EV. Further, the fourth transistor T4 may turn ON as the first supply voltage VDD ramps up such that a voltage difference (e.g., the gate to source voltage) between the first supply voltage VDD at the first current terminal of the fourth transistor T4 and the enable voltage EV at the control terminal of the fourth transistor T4, is less than a fourth threshold voltage (e.g., −0.2V) of the fourth transistor T4. Additionally, the fifth transistor T5 may turn ON such that the trigger voltage TV equals the first supply voltage VDD.

The first feedback transistor 210 may be turned OFF as a voltage at the first current terminal of the first feedback transistor 210 equals a voltage (e.g., the first supply voltage VDD) at the control terminal of the first feedback transistor 210. Further, the second feedback transistor 212 is turned ON as a voltage at the second current terminal of the second feedback transistor 212 equals a voltage (e.g., the first supply voltage VDD) at the control terminal of the second feedback transistor 212. The second feedback transistor 212 may be configured to generate the second intermediate voltage that equals the first supply voltage VDD such that the second current terminal of the sixth transistor T6 may receive the first supply voltage VDD.

The first output voltage F1 may be at the second supply voltage VSS (e.g., 0V) as the trigger voltage TV is above the second supply voltage VSS (e.g., the first supply voltage VDD). In an exemplary scenario, during the ramp-up of the first supply voltage VDD, the first output voltage F1 equals the first supply voltage VDD based on a leakage current from the first logic gate 214. The second logic gate 216 may only assert the reset signal RST when the first output voltage F1 equals the first supply voltage VDD and the enable voltage EV is above the second supply voltage VSS. In other words, the second logic gate 216 may prevent an unintended assertion of the reset signal RST.

At time instance I1, the first supply voltage VDD exceeds the first threshold voltage. The enable voltage EV may ramp up to the first threshold voltage in the first time period such that the first time period may correspond to a time period I0-I2.

The first capacitor 208 may charge based on the voltage difference between the enable voltage EV and the second supply voltage VSS. The control voltage VC may ramp-up as the enable voltage EV ramps up. Further, based on the control voltage VC, the rate of increase of the voltage difference (e.g., the gate to source voltage) between the first supply voltage VDD at the first current terminal of the first transistor T1 and the control voltage VC at the control terminal of the first transistor T1, is reduced. Thus, the rate of change of the attribute associated with the first transistor T1 (e.g., the rate at which the ON resistance of the first transistor T1) alters.

At time instance I2, the enable voltage EV exceeds the first threshold voltage. In other words, the first supply voltage VDD may exceed the trip value at the time instance I2. Further, the second transistor T2, the third transistor T3, and the sixth transistor T6 may turn ON such that the control voltage VC is pulled down to the second supply voltage VSS. Further, the trigger voltage TV may fall to the second supply voltage VSS (e.g., the trigger voltage TV falls to the ground voltage). The first feedback transistor 210 may be turned ON as the voltage at the control terminal of the first feedback transistor 210 equals the second supply voltage VSS (e.g., the ground voltage). The first feedback transistor 210 may drive the voltage at the first current terminal of the fifth transistor T5 to the second supply voltage VSS.

The first logic gate 214 may generate the first output voltage F1 such that the first output voltage F1 equals the first supply voltage VDD based on the trigger voltage TV falling to the second supply voltage VSS. Further, the second logic gate 216 may receive the first output voltage F1 from the first logic gate 214, and the enable voltage EV from the first transistor T1. The second logic gate 216 may assert the reset signal RST as the first output voltage F1 equals the first supply voltage VDD and the enable voltage EV is above the second supply voltage VSS.

At time instance I2-I3, the first capacitor 208 may not be fully charged. Thus, the enable voltage EV is a reduced version of the first supply voltage VDD. Further, the control voltage VC and the trigger voltage TV are at the second supply voltage VSS. Additionally, the first output voltage F1 equals the first supply voltage VDD.

Beyond time instance I3, the first capacitor 208 may be fully charged and the control voltage VC is at the second supply voltage VSS such that the enable voltage EV equals the first supply voltage VDD. The reset signal RST remains at the logic high state. Further, the control voltage VC remains at the second supply voltage VSS.

Figure 4:
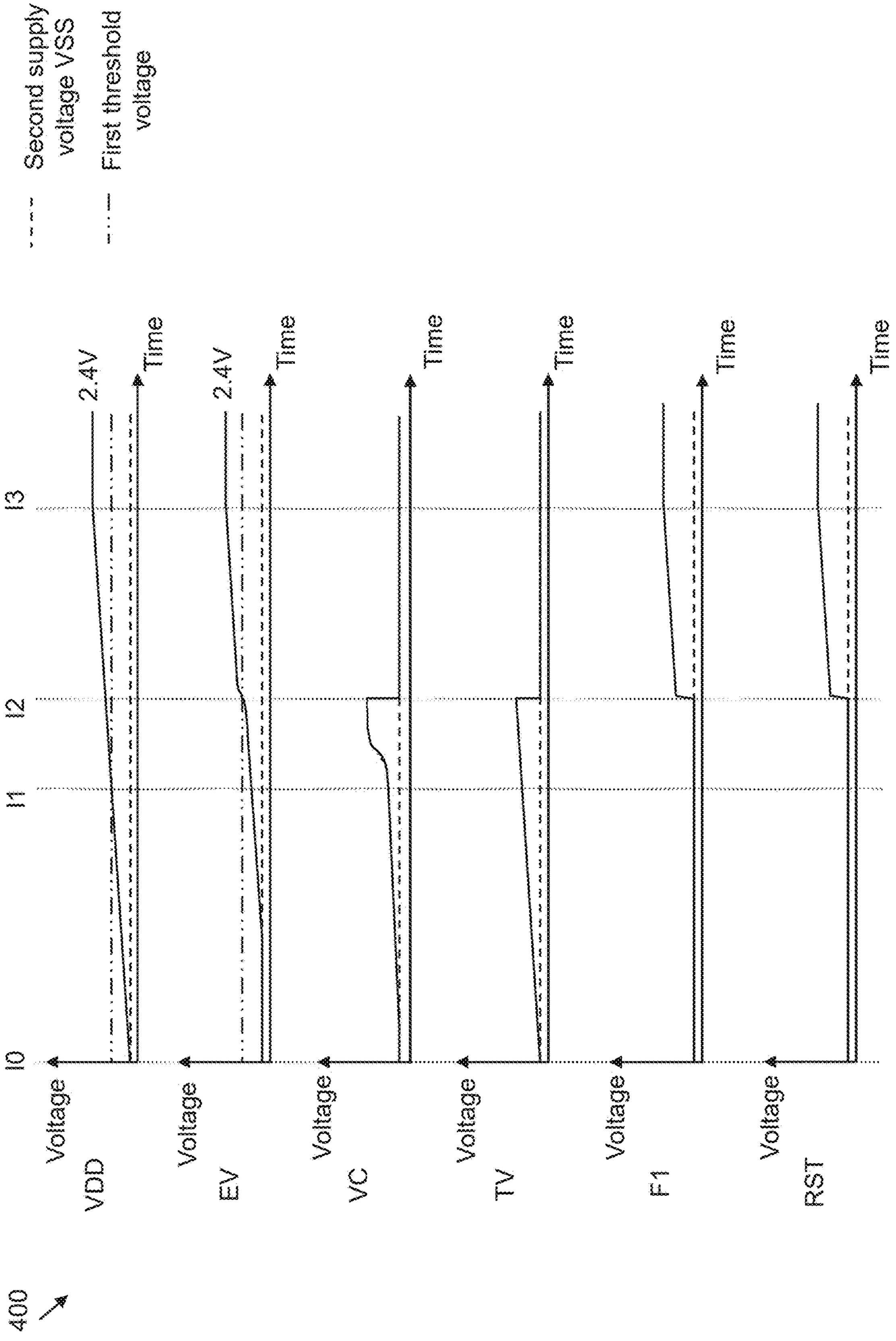
FIG. 4 represents a timing diagram that illustrates an operation of the POR circuit of the IC of FIG. 1 with a second ramp rate of the first supply voltage, in accordance with an embodiment of the present disclosure.

FIG. 4 represents a timing diagram 400 that illustrates the operation of the POR circuit 104 with a second ramp rate of the first supply voltage VDD, in accordance with an embodiment of the present disclosure.

The timing diagram 400 illustrates the first supply voltage VDD ramping at the second ramp rate (e.g., when the first supply voltage VDD ramps up from 0V to 2.4V in 25 ms).

At time instance I0, the IC 100 is powered up. The first transistor T1 is turned OFF and the enable voltage EV and the control voltage VC are at 0V. Further, the fourth transistor T4 and the fifth transistor T5 may be turned OFF.

During a time period I0-I1, the first supply voltage VDD may ramp-up. The first transistor T1 may generate the enable voltage EV when the first supply voltage VDD may further ramp-up and cross the second threshold voltage. As the enable voltage EV follows the first supply voltage VDD and is a reduced version of the first supply voltage VDD, the enable voltage EV ramps up during the time period I0-I1. Further, the enable voltage EV remains less than the first supply voltage VDD. Based on the enable voltage EV crossing the third threshold voltage of the second transistor T2 and the parasitic capacitance between the control terminal and the first current terminal of the second transistor T2, the control voltage VC may be generated. The control voltage VC follows the enable voltage EV and is a reduced version of the enable voltage EV, the control voltage VC ramps up during the time period I0-I1 and is less than the enable voltage EV. Further, the fourth transistor T4 may turn ON as the first supply voltage VDD ramps up such that a voltage difference (e.g., the gate to source voltage) between the first supply voltage VDD at the first current terminal of the fourth transistor T4 and the enable voltage EV at the control terminal of the fourth transistor T4, is less than a fourth threshold voltage (e.g., −0.2V) of the fourth transistor T4. Additionally, the fifth transistor T5 may turn ON such that the trigger voltage TV equals the first supply voltage VDD.

The first feedback transistor 210 may be turned OFF as a voltage at the first current terminal of the first feedback transistor 210 equals a voltage (e.g., the first supply voltage VDD) at the control terminal of the first feedback transistor 210. Further, the second feedback transistor 212 is turned ON as a voltage at the second current terminal of the second feedback transistor 212 equals a voltage (e.g., the first supply voltage VDD) at the control terminal of the second feedback transistor 212. The second feedback transistor 212 may be configured to generate the second intermediate voltage that equals the first supply voltage VDD such that the second current terminal of the sixth transistor T6 may receive the first supply voltage VDD.

The first output voltage F1 may fall to the second supply voltage VSS as the trigger voltage TV is above the second supply voltage VSS. In an exemplary scenario, during the ramp-up of the first supply voltage VDD, the first output voltage F1 equals the first supply voltage VDD based on a leakage current from the first logic gate 214. The second logic gate 216 may only assert the reset signal RST when the first output voltage F1 equals the first supply voltage VDD and the enable voltage EV is above the second supply voltage VSS. In other words, the second logic gate 216 may prevent an unintended assertion of the reset signal RST.

At time instance I1, the first supply voltage VDD exceeds the first threshold voltage. The enable voltage EV may ramp up to the first threshold voltage in the first time period such that the first time period may correspond to a time period I0-I2.

The first capacitor 208 may charge based on the voltage difference between the enable voltage EV and the second supply voltage VSS. The control voltage VC may ramp-up as the enable voltage EV ramps up. Further, based on the control voltage VC, the rate of increase of the voltage difference (e.g., the gate to source voltage) between the first supply voltage VDD at the first current terminal of the first transistor T1 and the control voltage VC at the control terminal of the first transistor T1, is reduced. Thus, the rate of change of the attribute associated with the first transistor T1 (e.g., the rate at which the ON resistance of the first transistor T1) alters.

At time instance I2, the enable voltage EV exceeds the first threshold voltage. In other words, the first supply voltage VDD may exceed the trip value at the time instance I2. Further, the second transistor T2, the third transistor T3, and the sixth transistor T6 may turn ON such that the control voltage VC is pulled down to the second supply voltage VSS and the trigger voltage TV falls to the second supply voltage VSS (e.g., the trigger voltage TV falls to the ground voltage). The first feedback transistor 210 may be turned ON as the voltage at the control terminal of the first feedback transistor 210 is equal to the second supply voltage VSS (e.g., the ground voltage). The first feedback transistor 210 may drive the voltage at the first current terminal of the fifth transistor T5 to the second supply voltage VSS.

The first logic gate 214 may generate the first output voltage F1 such that the first output voltage F1 equals the first supply voltage VDD based on the trigger voltage TV falling to the second supply voltage VSS. Further, the second logic gate 216 may receive the first output voltage F1 from the first logic gate 214, and the enable voltage EV from the first transistor T1. The second logic gate 216 may assert the reset signal RST as the first output voltage F1 equals the first supply voltage VDD and the enable voltage EV is above the second supply voltage VSS.

At time instance I2-I3, the first capacitor 208 may not be fully charged. Thus, the enable voltage EV is a reduced version of the first supply voltage VDD. Further, the control voltage VC and the trigger voltage TV are at the second supply voltage VSS. Additionally, the first output voltage F1 equals the first supply voltage VDD.

Beyond time instance I3, the first capacitor 208 may be fully charged and the control voltage VC is at the second supply voltage VSS such that the enable voltage EV equals the first supply voltage VDD. The reset signal RST remains at the logic high state. Further, the control voltage VC remains at the second supply voltage VSS.

Figure 5:
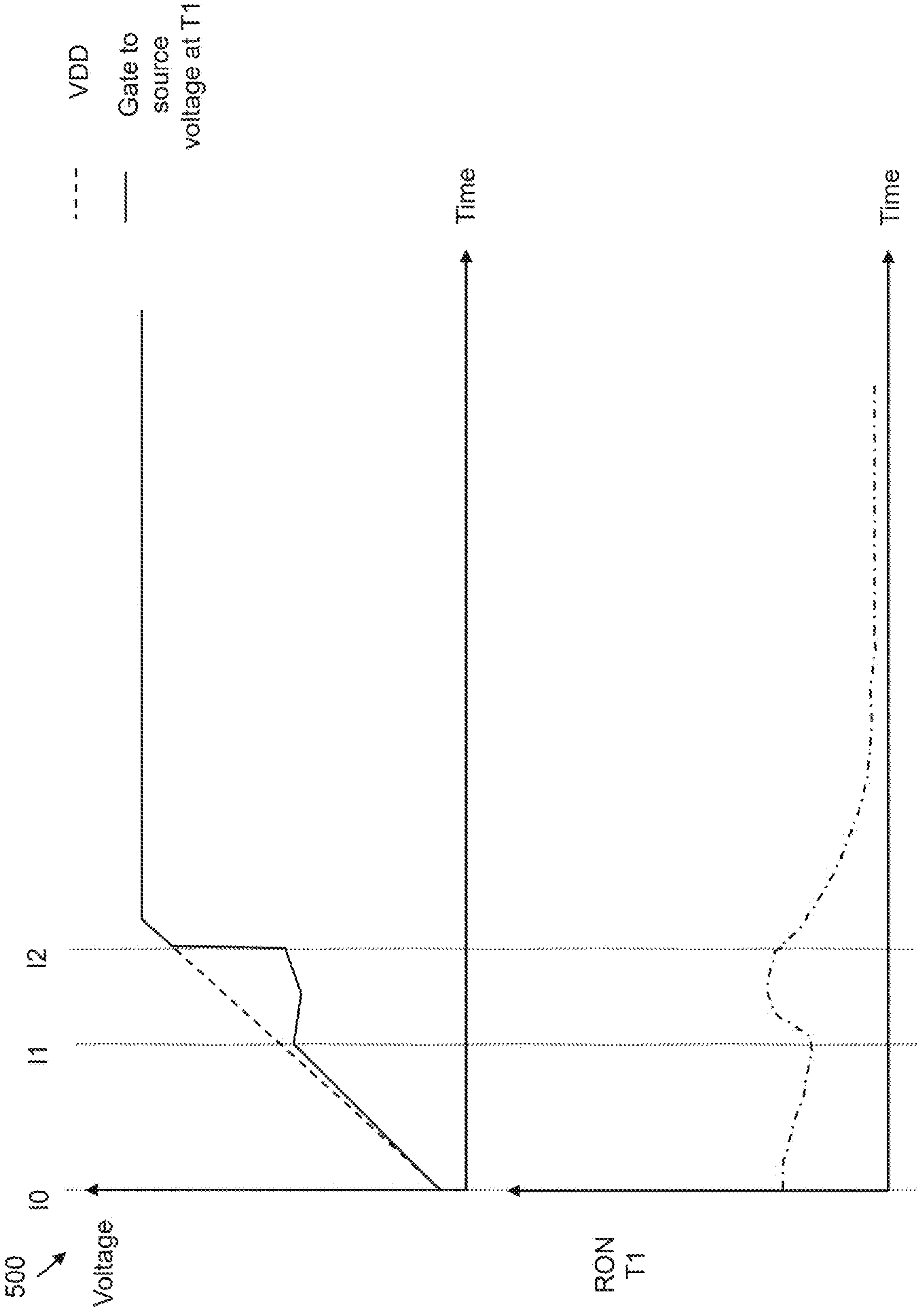
FIG. 5 represents a timing diagram that illustrates varying rate of change of an attribute and a voltage difference between the first supply voltage at a first current terminal and a control voltage at a control terminal, of a first transistor of the POR circuit of the IC of FIG. 1, in accordance with an embodiment of the present disclosure.

FIG. 5 represents a timing diagram 500 that illustrates varying rate of change of the attribute and the voltage difference between the first supply voltage VDD at the first current terminal and the control voltage CV at the control terminal, of the first transistor T1, in accordance with an embodiment of the present disclosure.

At time instance I0, the IC 100 is powered up. The first transistor T1 is turned OFF and the enable voltage EV and the control voltage VC are at 0V. Further, the fourth transistor T4 and the fifth transistor T5 may be turned OFF.

At time instance I0-I1, the rate of increase of the voltage difference between the first supply voltage VDD at the first current terminal of the first transistor T1 and the control voltage VC at the control terminal of the first transistor T1 is at the first rate. Additionally, the rate of change of the attribute associated with the first transistor T1 is at a fifth rate.

At time instance I1-I2, the rate of increase of the voltage difference between the first supply voltage VDD at the first current terminal of the first transistor T1 and the control voltage VC at the control terminal of the first transistor T1 reduces from the first rate to the second rate. Thus, the rate of change of the attribute associated with the first transistor T1 (e.g., the rate at which the ON resistance of the first transistor T1) alters to a sixth rate.

Beyond time instance I2, the control voltage CV is pulled to the second supply voltage VSS. Thus, the voltage difference between the first supply voltage VDD at the first current terminal of the first transistor T1 and the control voltage VC at the control terminal of the first transistor T1 equals the first supply voltage VDD. Further, the attribute of the first transistor T1 reduces gradually as the voltage difference between the first supply voltage VDD at the first current terminal of the first transistor T1 and the control voltage VC at the control terminal of the first transistor T1 rises.

The scope of the present disclosure is not limited to the delay circuit 202, the hysteresis circuit 204, and the logic circuit 206 being implemented in the above-described manner. In various other embodiments, different or additional components may be utilized for implementing the delay circuit 202, the hysteresis circuit 204, and the logic circuit 206, without deviating from the scope of the present disclosure.

An area occupied by the POR circuit 104 on the IC 100 is less as compared to conventional POR circuits that provide the same trip level accuracy, time delay over a wide range of the first supply voltage VDD (e.g., 2.4V-5.5V), and ramp-up rates of the first supply voltage VDD (e.g., 100 µs-100 ms) as the POR circuit 104. Further, the trip level accuracy and time delay are maintained across a wide temperature range (e.g., –40° C.-125° C.) by the POR circuit 104. During the steady state of the first supply voltage VDD, the signal levels generated by the POR circuit 104 match one of the first supply voltage VDD and the second supply voltage VSS (e.g., the ground voltage). In other words, low impedance paths between the first supply voltage terminal and the second supply voltage terminal are prevented during the steady state in the POR circuit 104 of the present disclosure. Thus, the consumption of non-zero steady-state currents by the POR circuit 104 is prevented. Consequently, the power consumed by the IC 100 of the present disclosure is significantly lower than that of an IC that includes conventional POR circuits. Therefore, the POR circuit 104 of the present disclosure is significantly more efficient and compact than conventional POR circuits. As the reset signal RST is asserted based on the enable voltage EV and the first output voltage F1, an effect of leakage current on the assertion of the reset signal RST is minimal. Therefore, the POR circuit 104 of the present disclosure is significantly robust across process, voltage, and temperature (PVT), and different supply ramp-up rates.

In an embodiment, a circuit may comprise a power-on reset (POR) circuit. The POR circuit may comprise a first transistor, a first capacitor, a stack of transistors, and a logic circuit. The first transistor may comprise a first current terminal, a control terminal, and a second current terminal. The first current terminal of the first transistor may be configured to receive a first supply voltage from a first supply voltage terminal. The control terminal of the first transistor may be configured to receive a control voltage. Further, the second current terminal of the first transistor may be configured to generate an enable voltage. The first capacitor may be coupled between the second current terminal of the first transistor and a second supply voltage terminal. The stack of transistors may comprise a first supply terminal configured to receive the first supply voltage, a second supply terminal configured to receive a second supply voltage, and an input terminal that is coupled to the second current terminal of the first transistor, and configured to receive the enable voltage. Further, the stack of transistors may comprise a first output terminal that may be coupled to the control terminal of the first transistor, and may be configured to generate the control voltage. The stack of transistors may further comprise a second output terminal that may be configured to generate a trigger voltage based on the first supply voltage and the enable voltage. The logic circuit may be coupled to the second current terminal of the first transistor and the second output terminal of the stack of transistors, and configured to receive the enable voltage and the trigger voltage. The logic circuit may be further configured to generate a reset signal based on the enable voltage and the trigger voltage.

In some embodiments, the stack of transistors may further comprise a stack of first conductivity type transistors and a stack of second conductivity type transistors, wherein the stack of first conductivity type transistors and the stack of second conductivity type transistors may be connected together at a first output node, and wherein the first output node may correspond to the second output terminal of the stack of transistors such that the trigger voltage may be generated at the first output node.

In some embodiments, the stack of transistors may further comprise a second transistor and a third transistor. The second transistor may comprise a control terminal, a first current terminal, and a second current terminal. The control terminal of the second transistor may be configured to receive the enable voltage. The first current terminal of the second transistor may be coupled to the control terminal of the first transistor, wherein the first current terminal of the second transistor may correspond to the first output terminal of the stack of transistors. The third transistor may comprise a control terminal, a first current terminal, and a second current terminal. The control terminal of the third transistor may be configured to receive the enable voltage. Further, the second current terminal of the third transistor may be coupled to the first current terminal of the second transistor.

In some embodiments, the stack of transistors may further comprise a fourth transistor and a fifth transistor. The fourth transistor may comprise a control terminal, a first current terminal, and a second current terminal. The control terminal of the fourth transistor may be configured to receive the enable voltage. The first current terminal of the fourth transistor may be configured to receive the first supply voltage, wherein the first current terminal of the fourth transistor may correspond to the first supply terminal of the stack of transistors. Further, the fifth transistor may comprise a control terminal, a first current terminal, and a second current terminal. The control terminal of the fifth transistor may be configured to receive the enable voltage. The first current terminal of the fifth transistor may be coupled to the second current terminal of the fourth transistor. Further, the second current terminal of the fifth transistor may be coupled to the second current terminal of the second transistor, and may be configured to generate the trigger voltage, wherein the coupling between the second current terminals of the second transistor and the fifth transistor may correspond to the second output terminal of the stack of transistors.

In some embodiments, the stack of transistors further comprises a sixth transistor may comprise a control terminal, a first current terminal, and a second current terminal. The control terminal of the sixth transistor may be configured to receive the enable voltage, wherein coupling between the control terminals of the second transistor, the third transistor, the fourth transistor, the fifth transistor, and the sixth transistor that receive the enable voltage may correspond to the input terminal of the stack of transistors. The first current terminal of the sixth transistor may be configured to receive the second supply voltage, wherein the first current terminal of the sixth transistor may correspond to the second supply terminal of the stack of transistors. The second current terminal of the sixth transistor may be coupled to the first current terminal of the third transistor.

In some embodiments, the circuit may further comprise a first feedback transistor and a second feedback transistor. The first feedback transistor may comprise a control terminal, a first current terminal, and a second current terminal. The control terminal of the first feedback transistor may be coupled to the second current terminal of the fifth transistor. The first current terminal of the first feedback transistor may be coupled to the second current terminal of the fourth transistor. The second current terminal of the first feedback transistor may be configured to receive the second supply voltage. The control terminal of the second feedback transistor may be coupled to the second current terminal of the fifth transistor. The first current terminal of the second feedback transistor may be coupled to the first current terminal of the third transistor. The second current terminal of the second feedback transistor may be configured to receive the first supply voltage.

In some embodiments, the circuit may further comprise a second capacitor that may be coupled between the first current terminal of the second transistor and the second supply voltage terminal, wherein the first capacitor may charge based on a voltage difference between the enable voltage at the second current terminal of the first transistor and the second supply voltage at the second supply voltage terminal, and wherein the second capacitor may charge based on a voltage difference between the control voltage at the first current terminal of the second transistor and the second supply voltage at the second supply voltage terminal.

In some embodiments, the logic circuit may comprise a first logic gate that may be coupled to the second output terminal of the stack of transistors, and configured to receive the trigger voltage. The first logic gate may be further configured to generate a first output voltage based on the trigger voltage, wherein the first output voltage may be an inverted version of the trigger voltage. The logic circuit may further comprise a second logic gate that may be coupled to the first logic gate and the second current terminal of the first transistor, and configured to receive the first output voltage and the enable voltage. The second logic gate may be further configured to generate the reset signal based on the first output voltage and the enable voltage, wherein the reset signal may be asserted when the first output voltage equals the first supply voltage and the enable voltage may be above the second supply voltage.

In some embodiments, the reset signal may be a logical AND of the enable voltage and the first output voltage.

In another embodiment, a circuit may comprise a power-on reset (POR) circuit. The POR circuit may comprise a first transistor and a stack of transistors. The first transistor may comprise a first current terminal, a control terminal, and a second current terminal. The first current terminal of the first transistor may be configured to receive a first supply voltage from a first supply voltage terminal. The control terminal of the first transistor may be configured to receive a control voltage. The second current terminal of the first transistor may be configured to generate an enable voltage. The stack of transistors may be coupled to the second current terminal and the control terminal of the first transistor, wherein the stack of transistors may be configured to receive the enable voltage. The stack of transistors may be further configured to generate the control voltage and a trigger voltage, wherein when the enable voltage may be less than a first threshold voltage associated with the stack of transistors, the control voltage may increase based on an increase in the enable voltage, and the trigger voltage may remain above a second supply voltage, wherein when the control voltage increases, the enable voltage may ramp up to the first threshold voltage in a first time period, and wherein when the enable voltage equals the first threshold voltage at an end of the first time period, the trigger voltage may fall to the second supply voltage, thereby asserting a reset signal of the POR circuit.

In some embodiments, the circuit may further comprise a logic circuit that may be coupled to the stack of transistors and the second current terminal of the first transistor, wherein the logic circuit may be configured to receive the trigger voltage and the enable voltage. The logic circuit may be further configured to generate the reset signal based on the trigger voltage and the enable voltage.

In some embodiments, when the control voltage may increase, a rate of increase of a voltage difference between (i) the first supply voltage at the first current terminal of the first transistor and (ii) the control voltage at the control terminal of the first transistor, may reduce from a first rate to a second rate, and wherein when the first supply voltage may be less than a second threshold voltage of the first transistor, the rate of increase of the voltage difference between the first supply voltage at the first current terminal and the control voltage at the control terminal may be at the first rate.

In some embodiments, when the rate of increase of the voltage difference between the first supply voltage at the first current terminal and the control voltage at the control terminal reduces from the first rate to the second rate, a rate of change of an attribute of the first transistor may alters.

In some embodiments, the attribute of the first transistor may be one of a group consisting of resistance, impedance, admittance, and reactance.

In some embodiments, the stack of transistors may comprise a stack of first conductivity type transistors that may be coupled to the first transistor, and wherein the stack of first conductivity type transistors may be configured to receive the enable voltage. The stack of first conductivity type transistors may be further configured to pull down the control voltage to the second supply voltage when the enable voltage equals the first threshold voltage, wherein when the control voltage may be pulled down to the second supply voltage, the enable voltage may ramp up to the first supply voltage in a second time period.

In some embodiments, the stack of first conductivity type transistors may comprise a second transistor and a third transistor. The second transistor may comprise a control terminal, a first current terminal, and a second current terminal. The control terminal of the second transistor may be configured to receive the enable voltage. The first current terminal of the second transistor may be coupled to the control terminal of the first transistor. The third transistor may comprise a control terminal, a first current terminal, and a second current terminal. The control terminal of the third transistor may be configured to receive the enable voltage. Further, the second current terminal of the third transistor may be coupled to the first current terminal of the second transistor In some embodiments, the stack of transistors may further comprise a stack of second conductivity type transistors coupled to the first transistor, wherein the stack of second conductivity type transistors may be configured to receive the first supply voltage and the enable voltage. The stack of second conductivity type transistors may be further configured to generate the trigger voltage based on the first supply voltage and the enable voltage, wherein when the enable voltage may be less than the first threshold voltage, the trigger voltage equals the first supply voltage, and when the trigger voltage may fall to the second supply voltage, the enable voltage may be above the first threshold voltage.

In some embodiments, the stack of second conductivity type transistors comprises a fourth transistor and a fifth transistor. The fourth transistor may comprise a control terminal, a first current terminal, and a second current terminal. The control terminal of the fourth transistor may be configured to receive the enable voltage. The first current terminal of the fourth transistor may be configured to receive the first supply voltage. Further, the fifth transistor may comprise a control terminal, a first current terminal, and a second current terminal. The control terminal of the fifth transistor may be configured to receive the enable voltage. The first current terminal of the fifth transistor may be coupled to the second current terminal of the fourth transistor. Further, the second current terminal of the fifth transistor may be coupled to the second current terminal of the second transistor, and may be configured to generate the trigger voltage.

In some embodiments, the stack of first conductivity type transistors may further comprise a sixth transistor comprising a control terminal, a first current terminal, and a second current terminal. The control terminal of the sixth transistor may be configured to receive the enable voltage. The first current terminal of the sixth transistor may be configured to receive a second supply voltage terminal. The second current terminal of the sixth transistor may be coupled to the first current terminal of the third transistor.

In some embodiments, the circuit further comprises a first capacitor and a second capacitor. The first capacitor may be coupled between the second current terminal of the first transistor and the second supply voltage terminal, wherein the first capacitor may charge based on a voltage difference between the enable voltage at the second current terminal of the first transistor and the second supply voltage at the second supply voltage terminal. The second capacitor may be coupled between the first current terminal of the second transistor and the second supply voltage terminal, wherein the second capacitor may charge based on a voltage difference between the control voltage at the first current terminal of the second transistor and the second supply voltage at the second supply voltage terminal, and wherein the control voltage may be regulated based on the charging of the second capacitor.

In the present disclosure, the term "assert" is used to mean placing a signal in an active state. For example, for an active-low signal, the signal is at a logic-low state when asserted, and for an active-high signal, the signal is at a logic-high state when asserted.

While various embodiments of the present disclosure have been illustrated and described, it will be clear that the present disclosure is not limited to these embodiments only. Numerous modifications, changes, variations, substitutions, and equivalents will be apparent to those skilled in the art, without departing from the spirit and scope of the present disclosure, as described in the claims. Further, unless stated otherwise, terms such as "first" and "second" are used to arbitrarily distinguish between the elements such terms describe. Thus, these terms are not necessarily intended to indicate temporal or other prioritization of such elements.

We claim:

1. A circuit comprising:

a power-on reset (POR) circuit comprising:

a first transistor comprising:

a first current terminal that is configured to receive a first supply voltage from a first supply voltage terminal;

a control terminal configured to receive a control voltage; and a second current terminal configured to generate an enable voltage;

a first capacitor coupled between the second current terminal of the first transistor and a second supply voltage terminal;

a stack of transistors comprising:

a first supply terminal configured to receive the first supply voltage;

a second supply terminal configured to receive a second supply voltage;

an input terminal that is coupled to the second current terminal of the first transistor, and configured to receive the enable voltage;

a first output terminal that is coupled to the control terminal of the first transistor, and configured to generate the control voltage; and a second output terminal configured to generate a trigger voltage based on the first supply voltage and the enable voltage;

a second transistor comprising:

a control terminal configured to receive the enable voltage;

a first current terminal coupled to the control terminal of the first transistor, wherein the first current terminal of the second transistor corresponds to the first output terminal of the stack of transistors; and a second current terminal corresponding to the second output terminal of the stack of transistors; and a logic circuit that is coupled to the second current terminal of the first transistor and the second output terminal of the stack of transistors, and configured to:

receive the enable voltage and the trigger voltage; and generate a reset signal based on the enable voltage and the trigger voltage.

2. The circuit of claim 1, wherein the stack of transistors further comprises a stack of first conductivity type transistors and a stack of second conductivity type transistors, wherein the stack of first conductivity type transistors and the stack of second conductivity type transistors are connected together at a first output node, and wherein the first output node corresponds to the second output terminal of the stack of transistors such that the trigger voltage is generated at the first output node.

3. The circuit of claim 1, wherein the stack of transistors further comprises:

a third transistor comprising:

a control terminal configured to receive the enable voltage;

a first current terminal; and a second current terminal coupled to the first current terminal of the second transistor.

4. The circuit of claim 3, further comprising:

a second capacitor coupled between the first current terminal of the second transistor and the second supply voltage terminal, wherein the first capacitor charges based on a voltage difference between the enable voltage at the second current terminal of the first transistor and the second supply voltage at the second supply voltage terminal, and wherein the second capacitor charges based on a voltage difference between the control voltage at the first current terminal of the second transistor and the second supply voltage at the second supply voltage terminal.

5. A circuit comprising:

a power-on reset (POR) circuit comprising:

a first transistor comprising:

a first current terminal that is configured to receive a first supply voltage from a first supply voltage terminal;

a control terminal configured to receive a control voltage; and a second current terminal configured to generate an enable voltage;

a first capacitor coupled between the second current terminal of the first transistor and a second supply voltage terminal;

a stack of transistors comprising:

a first supply terminal configured to receive the first supply voltage;

a second supply terminal configured to receive a second supply voltage;

an input terminal that is coupled to the second current terminal of the first transistor, and configured to receive the enable voltage;

a first output terminal that is coupled to the control terminal of the first transistor, and configured to generate the control voltage; and a second output terminal configured to generate a trigger voltage based on the first supply voltage and the enable voltage; and a logic circuit that is coupled to the second current terminal of the first transistor and the second output terminal of the stack of transistors, and configured to:

receive the enable voltage and the trigger voltage; and generate a reset signal based on the enable voltage and the trigger voltage:

wherein the stack of transistors further comprises:

a second transistor comprising:

a control terminal configured to receive the enable voltage;

a first current terminal coupled to the control terminal of the first transistor, wherein the first current terminal of the second transistor corresponds to the first output terminal of the stack of transistors; and a second current terminal; and a third transistor comprising:

a control terminal configured to receive the enable voltage;

a first current terminal; and a second current terminal coupled to the first current terminal of the second transistor;

wherein the stack of transistors further comprises:

a fourth transistor comprising:

a control terminal configured to receive the enable voltage;

a first current terminal configured to receive the first supply voltage, wherein the first current terminal of the fourth transistor corresponds to the first supply terminal of the stack of transistors; and a second current terminal; and a fifth transistor comprising:

a control terminal configured to receive the enable voltage;

a first current terminal coupled to the second current terminal of the fourth transistor; and a second current terminal coupled to the second current terminal of the second transistor, and configured to generate the trigger voltage, wherein the coupling between the second current terminals of the second transistor and the fifth transistor corresponds to the second output terminal of the stack of transistors.

6. The circuit of claim 5 wherein the stack of transistors further comprises:

a sixth transistor comprising:

a control terminal configured to receive the enable voltage, wherein coupling between the control terminals of the second transistor, the third transistor, the fourth transistor, the fifth transistor, and the sixth transistor that receive the enable voltage, corresponds to the input terminal of the stack of transistors;

a first current terminal configured to receive the second supply voltage, wherein the first current terminal corresponds to the second supply terminal of the stack of transistors; and a second current terminal coupled to the first current terminal of the third transistor.

7. The circuit of claim 6, further comprising:

a first feedback transistor comprising:

a control terminal coupled to the second current terminal of the fifth transistor;

a first current terminal coupled to the second current terminal of the fourth transistor; and a second current terminal configured to receive the second supply voltage; and a second feedback transistor comprising:

a control terminal coupled to the second current terminal of the fifth transistor;

a first current terminal coupled to the first current terminal of the third transistor; and a second current terminal configured to receive the first supply voltage.

8. A circuit comprising:

a power-on reset (POR) circuit comprising:

a first transistor comprising:

a first current terminal configured to receive a first supply voltage from a first supply voltage terminal;

a control terminal configured to receive a control voltage; and a second current terminal configured to generate an enable voltage; and a stack of transistors coupled to the second current terminal and the control terminal of the first transistor, wherein the stack of transistors is configured to:

receive the enable voltage; and generate the control voltage and a trigger voltage, (i) wherein when the enable voltage is less than a first threshold voltage associated with the stack of transistors, the control voltage increases based on an increase in the enable voltage, and the trigger voltage remains above a second supply voltage, (ii) wherein when the control voltage increases, the enable voltage ramps up to the first threshold voltage in a first time period, and (iii) wherein when the enable voltage equals the first threshold voltage at an end of the first time period, the trigger voltage falls to the second supply voltage, thereby asserting a reset signal of the POR circuit.

9. The circuit of claim 8, further comprising a logic circuit that is coupled to the stack of transistors and the second current terminal of the first transistor, wherein the logic circuit is configured to:

receive the trigger voltage and the enable voltage; and generate the reset signal based on the trigger voltage and the enable voltage.

10. The circuit of claim 8, wherein when the control voltage increases, a rate of increase of a voltage difference between (i) the first supply voltage at the first current terminal of the first transistor and (ii) the control voltage at the control terminal of the first transistor, reduces from a first rate to a second rate, and wherein when the first supply voltage is less than a second threshold voltage of the first transistor, the rate of increase of the voltage difference between the first supply voltage at the first current terminal and the control voltage at the control terminal is at the first rate.

11. The circuit of claim 10, wherein when the rate of increase of the voltage difference between the first supply voltage at the first current terminal and the control voltage at the control terminal reduces from the first rate to the second rate, a rate of change of an attribute of the first transistor alters.

12. The circuit of claim 11, wherein the attribute of the first transistor is one of a group consisting of resistance, impedance, admittance, and reactance.

13. The circuit of claim 8, wherein the stack of transistors comprises a stack of first conductivity type transistors coupled to the first transistor, and wherein the stack of first conductivity type transistors is configured to:

receive the enable voltage; and pull down the control voltage to the second supply voltage when the enable voltage equals the first threshold voltage, wherein when the control voltage is pulled down to the second supply voltage, the enable voltage ramps up to the first supply voltage in a second time period.

14. The circuit of claim 13, wherein the stack of first conductivity type transistors comprises:

a second transistor comprising:

a control terminal configured to receive the enable voltage;

a first current terminal coupled to the control terminal of the first transistor, and configured to generate the control voltage; and a second current terminal; and a third transistor comprising:

a control terminal configured to receive the enable voltage;

a first current terminal; and a second current terminal coupled to the first current terminal of the second transistor.

15. The circuit of claim 14, wherein the stack of transistors further comprises a stack of second conductivity type transistors coupled to the first transistor, and wherein the stack of second conductivity type transistors is configured to:

receive the first supply voltage and the enable voltage; and generate the trigger voltage based on the first supply voltage and the enable voltage, wherein when the enable voltage is less than the first threshold voltage, the trigger voltage equals the first supply voltage, and when the trigger voltage falls to the second supply voltage, the enable voltage is above the first threshold voltage.

16. The circuit of claim 15, wherein the stack of second conductivity type transistors comprises:

a fourth transistor comprising:

a control terminal configured to receive the enable voltage;

a first current terminal configured to receive the first supply voltage; and a second current terminal; and a fifth transistor comprising:

a control terminal configured to receive the enable voltage;

a first current terminal coupled to the second current terminal of the fourth transistor; and a second current terminal coupled to the second current terminal of the second transistor, and configured to generate the trigger voltage.

17. The circuit of claim 16, wherein the stack of first conductivity type transistors further comprises:

a sixth transistor comprising:

a control terminal configured to receive the enable voltage;

a first current terminal configured to receive the second supply voltage; and a second current terminal coupled to the first current terminal of the third transistor.

18. The circuit of claim 16, further comprising:

a first capacitor coupled between the second current terminal of the first transistor and the second supply voltage terminal, wherein the first capacitor charges based on a voltage difference between the enable voltage at the second current terminal of the first transistor and the second supply voltage at the second supply voltage terminal, and wherein the enable voltage is regulated based on the charging of the first capacitor; and a second capacitor coupled between the first current terminal of the second transistor and the second supply voltage terminal, wherein the second capacitor charges based on a voltage difference between the control voltage at the first current terminal of the second transistor and the second supply voltage at the second supply voltage terminal, and wherein the control voltage is regulated based on the charging of the second capacitor.

19. A circuit comprising:

a power-on reset (POR) circuit comprising:

a first transistor comprising:

a first current terminal that is configured to receive a first supply voltage from a first supply voltage terminal;

a control terminal configured to receive a control voltage; and a second current terminal configured to generate an enable voltage;

a first capacitor coupled between the second current terminal of the first transistor and a second supply voltage terminal;

a stack of transistors comprising:

a first supply terminal configured to receive the first supply voltage;

a second supply terminal configured to receive a second supply voltage;

an input terminal that is coupled to the second current terminal of the first transistor, and configured to receive the enable voltage;

a first output terminal that is coupled to the control terminal of the first transistor, and configured to generate the control voltage; and a second output terminal configured to generate a trigger voltage based on the first supply voltage and the enable voltage; and a logic circuit that includes a first input coupled to the second current terminal of the first transistor to receive the enable voltage, a second input coupled to the second output terminal of the stack of transistors to receive the trigger voltage, and an output configured to generate a reset signal based on the enable voltage and the trigger voltage.

20. The circuit of claim 19, wherein the logic circuit comprises:

a first logic gate that is coupled to the second output terminal of the stack of transistors, and configured to:

receive the trigger voltage; and generate a first output voltage based on the trigger voltage, wherein the first output voltage is an inverted version of the trigger voltage; and a second logic gate that is coupled to the first logic gate and the second current terminal of the first transistor, and configured to:

receive the first output voltage and the enable voltage; and generate the reset signal based on the first output voltage and the enable voltage, wherein the reset signal is asserted when the first output voltage equals the first supply voltage and the enable voltage is above the second supply voltage.

21. The circuit of claim 20, wherein the reset signal is a logical AND of the enable voltage and the first output voltage.

* * * * *